(12) United States Patent
Tae et al.

(10) Patent No.: US 8,463,563 B2
(45) Date of Patent: Jun. 11, 2013

(54) BATTERY MANAGEMENT SYSTEM AND DRIVING METHOD THEREOF

(75) Inventors: Yongjun Tae, Yongin-si (KR); Andre Boehm, Yongin-si (KR)

(73) Assignees: Samsung SDI Co., Ltd., Yongin-si (KR); Robert Bosch GmbH, Stuttgart (DE)

( * ) Notice: Subject to any disclaimer, the term of this patent is extended or adjusted under 35 U.S.C. 154(b) by 376 days.

(21) Appl. No.: 12/817,381

(22) Filed: Jun. 17, 2010

(65) Prior Publication Data

US 2011/0184677 A1    Jul. 28, 2011

(30) Foreign Application Priority Data

Jan. 26, 2010 (KR) .................. 10-2010-0007050

(51) Int. Cl.
*G01R 31/36* (2006.01)
*G01R 27/00* (2006.01)
*H02J 7/00* (2006.01)
*H02J 7/04* (2006.01)

(52) U.S. Cl.
USPC ............... 702/63; 702/65; 320/132; 320/134

(58) Field of Classification Search
USPC ............... 702/63, 64, 65; 320/125, 124, 132, 320/134; 324/433
See application file for complete search history.

(56) References Cited

U.S. PATENT DOCUMENTS

| | | | |
|---|---|---|---|
| 8,264,201 B2 * | 9/2012 | Tae et al. ...................... | 320/118 |
| 2002/0084785 A1 | 7/2002 | Park | |
| 2003/0052646 A1 | 3/2003 | Minamiura et al. | |
| 2008/0036421 A1 | 2/2008 | Seo et al. | |

(Continued)

FOREIGN PATENT DOCUMENTS

| JP | 2001-006750 A | 1/2001 |
|---|---|---|
| JP | 2003-204627 A | 7/2003 |

(Continued)

OTHER PUBLICATIONS

Extended European Search Report dated Jan. 24, 2011, issued in corresponding European Patent Application No. 10189941.7, 5 pages.

(Continued)

*Primary Examiner* — Eliseo Ramos Feliciano
*Assistant Examiner* — Ricky Ngon
(74) *Attorney, Agent, or Firm* — Christie, Parker & Hale, LLP

(57) ABSTRACT

A battery management system and a driving method thereof are disclosed, which may detect a short battery cell capable of causing short among a plurality of battery cells during a parking period of a vehicle. The battery management system includes a sensing unit for measuring a cell voltage and a cell current of each of a plurality of battery cells and an MCU for measuring an SOC of each of the battery cells to control charge and discharge by utilizing the cell voltage and the cell current of each of the battery cells. The MCU measures a first SOC of each of the battery cells in a key-off state and a second SOC of each of the battery cells in a key-on state after the key-off state. The MCU utilizes the first SOC, the second SOC, and a time period between the first and second SOCs to determine a short battery cell among the plurality of battery cells.

15 Claims, 3 Drawing Sheets

U.S. PATENT DOCUMENTS

| | | |
|---|---|---|
| 2008/0054850 A1 | 3/2008 | Tae et al. |
| 2008/0088279 A1 | 4/2008 | Lim et al. |
| 2008/0091362 A1 | 4/2008 | Tae et al. |
| 2009/0085516 A1* | 4/2009 | Emori et al. ................ 320/118 |
| 2009/0099799 A1 | 4/2009 | Barsoukov et al. |
| 2010/0280687 A1* | 11/2010 | Tate et al. ....................... 701/22 |

FOREIGN PATENT DOCUMENTS

| | | | |
|---|---|---|---|
| JP | 2003-338325 A | | 11/2003 |
| JP | 2005-261072 A | | 9/2005 |
| JP | 2006-337155 A | | 12/2006 |
| JP | 2008-062913 A | | 3/2008 |
| JP | 2008-069691 | | 3/2008 |
| JP | 2008-098171 A | | 4/2008 |
| JP | 2009-252459 A | | 10/2009 |
| KR | 10-2002-0054779 A | | 7/2002 |
| KR | 10-2002-0054829 A | | 7/2002 |
| WO | WO 2009/119271 A1 | | 10/2009 |

OTHER PUBLICATIONS

English machine translation for Japanese publication No. JP 2008-069691 dated Mar. 27, 2008 to Kaneko et al., 24 pages.

Machine English Translation of JP 2006-337155 A, Dec. 14, 2006.

KIPO Notice of Allowance dated Jul. 20, 2011 for KR 10-2010-0007050 (5 pages).

JPO Notice of Allowance dated Apr. 10, 2012 for JP 2010-132387 (2 pages).

Machine English Translation of JP 2001-006750 A (13 pages), Jan. 12, 2001.

Machine English Translation of JP 2003-338325 A (4 pages), Nov. 28, 2003.

Machine English Translation of JP 2005-261072 A (12 pages), Sep. 22, 2005.

Machine English Translation of JP 2009-252459 A (16 pages), Oct. 29, 2009.

* cited by examiner

BATTERY MANAGEMENT SYSTEM AND DRIVING METHOD THEREOF

CROSS-REFERENCE TO RELATED APPLICATION

This application claims priority to and the benefit of Korean Patent Application No. 10-2010-0007050, filed Jan. 26, 2010, in the Korean Intellectual Property Office, the entire content of which is incorporated herein by reference.

BACKGROUND

1. Field

Aspects of embodiments of the present invention relate to a battery management system and a driving method thereof.

2. Description of the Related Art

Vehicles (e.g., cars) with a combustion engine, which uses gasoline or diesel as main fuel, generate serious pollution such as air pollution. Accordingly, an electric car or a hybrid car has been developed for reducing the generation of pollution.

The electric car is powered by an electric engine (or motor) that is driven by an electric energy outputted from a battery. Such an electric car includes a battery, in which a plurality of dischargeable/chargeable (i.e., rechargeable) battery cells are included in one pack, as a main power source. Therefore, the electric car does not generate an exhaust gas and produces lower noise.

The hybrid car is one that is in between a car using only a combustion engine and the electric car, and is one using two or more kinds of power sources, for example, a combustion engine and an electric motor. The hybrid car may be powered by a combustion engine and a fuel cell which directly obtains an electric energy by a chemical reaction between continuously supplied oxygen and hydrogen, or may be powered by a battery and a fuel cell.

In this way, since a car powered by an electric energy is directly affected by the performance of a battery cell, a Battery Management System (BMS) is provided to measure the voltage and current of each battery cell and the total voltages and currents of all battery cells to efficiently manage the discharge/charge of each battery cell, and detect a battery cell having decreased performance among the battery cells such that each battery cell may have maximum or increased performance.

SUMMARY

Aspects of embodiments of the present invention are directed toward a battery management system and a driving method thereof, which can detect a short battery cell capable of causing short among a plurality of battery cells during a parking period of a vehicle.

According to one embodiment of the present invention, a battery management system includes: a sensing unit for measuring a cell voltage and a cell current of each of a plurality of battery cells; and a Main Control Unit (MCU) for measuring a State Of Charge (SOC) of each of the battery cells to control charge and discharge by utilizing the cell voltage and the cell current of each of the battery cells, wherein the MCU includes: an SOC measurement unit for measuring a first SOC of each of the battery cells in a key-off state, and measuring a second SOC of each of the battery cells in a key-on state after the key-off state; and a controller for comparing whether a first difference value between the first SOC and the second SOC of each of the battery cells is greater than a first reference value or comparing whether a second difference value between a maximum value among the second SOC of each of the battery cells and the second SOC of each of the battery cells is greater than a second reference value to determine a short battery cell in which the first difference value is greater than the first reference value or the second difference value is greater than the second reference value from among the battery cells.

The key-off state may be a time when a power source of the battery management system is turned off.

The key-on state may be a time when a power source of the battery management system is turned on.

As a time period between the key-off state and the key-on state increases, the first reference value may increases.

As a time period between the key-off state and the key-on state increases, the second reference value may increases.

The MCU may further include a data storage for storing the first SOC, the second SOC, the first reference value and the second reference value.

The MCU may further include a timer for measuring a time of the key-off state and a time of the key-on state.

When the first difference value for each of the plurality of battery cells is less than the first reference value, the controller may be configured to compare whether the second difference value for at least one of the plurality of battery cells is greater than the second reference value.

When the second difference value for all the plurality of battery cells is less than the second reference value, the controller may be configured to compare whether the first difference value for at least one of the plurality of battery cells is greater than the first reference value.

The MCU may be coupled an Engine Controller Unit (ECU) and a display device of a vehicle (e.g., a car), and a time period between the key-off state and the key-on state may be a parking time of the vehicle.

The MCU may be configured to transmit information of the short battery cell to the ECU such that the ECU displays the information of the battery cell on the display device.

According to another embodiment, a driving method of a battery management system includes: measuring a first SOC of each of a plurality of battery cells in a key-off state, and measuring a second SOC of each of the battery cells in a key-on state after the key-off state; comparing whether a first difference value between the first SOC and second SOC of each of the battery cells is greater than a first reference value, or comparing whether a second difference value between a maximum value among the second SOC of each of the battery cells and the second SOC of each of the battery cells is greater than a second reference value; and determining a short battery cell in which the first difference value is greater than the first reference value or the second difference value is greater than the second reference value from among the battery cells.

In the comparing of whether the first difference value is greater than the first reference value or whether the second difference value is greater than the second reference value, the comparing whether the first difference value between the first SOC and second SOC of each of the battery cells is greater than the first reference value may be performed before the comparing whether the second difference value between the maximum value among the second SOC of each of the battery cells and the second SOC is greater than the second reference value.

The comparing of whether the first difference value is greater than the first reference value or whether the second difference value is greater than the second reference value may include comparing whether the second difference value is greater than the second reference value when the first difference value for all the plurality of battery cells is less than the first reference value.

In the comparing of whether the first difference value is greater than the first reference value or whether the second difference value is greater than the second reference value, the comparing whether the second difference value between the maximum value among the second SOC of each of the battery cells and the second SOC of each of the battery cells is greater than the second reference value may be performed before the comparing whether the first difference value between the first SOC and second SOC of the each battery cell is greater than the first reference value.

The comparing of whether the first difference value is greater than the first reference value or whether the second difference value is greater than the second reference value may include comparing whether the first difference value is greater than the first reference value when the second difference value for all the plurality of battery cells is less than the second reference value.

The driving method may further include displaying information of the short battery cell.

BRIEF DESCRIPTION OF THE DRAWINGS

The accompanying drawings are included to provide a further understanding of the present disclosure. The drawings illustrate exemplary embodiments of the present disclosure and, together with the description, serve to explain principles of the present disclosure. In the drawings.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the present invention to those skilled in the art.

In this disclosure below, when one part (or element, device, etc.) is referred to as being "connected" or "coupled" to another part (or element, device, etc.), it should be understood that the former may be directly connected or coupled to the latter, or electrically connected or coupled to the latter via one or more intervening parts (or elements, devices, etc.). Furthermore, when it is described that one comprises (or includes or has) some elements, it should be understood that it may comprise (or include or have) only those elements, or it may comprise (or include or have) other elements as well as those elements if there is no specific limitation.

Hereinafter, embodiments will be described in more detail with reference to the accompanying drawings.

Figure 1:
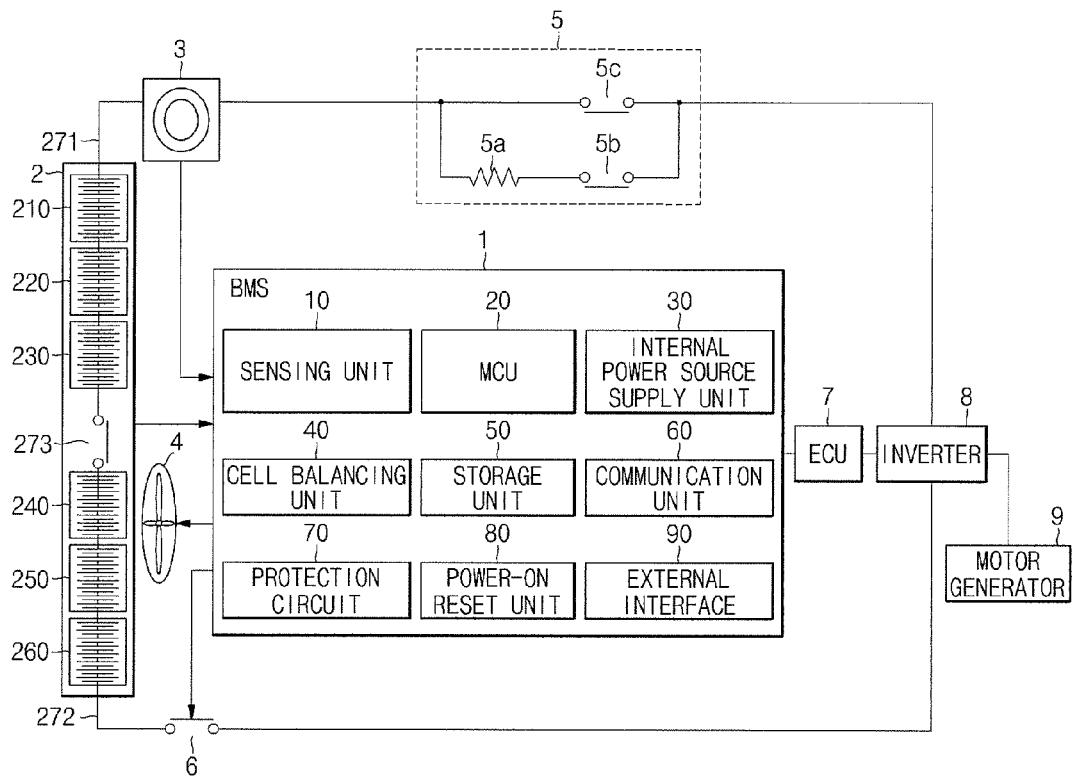
FIG. 1 is a diagram schematically illustrating a battery, a battery management system and devices peripheral to the battery management system, according to an embodiment.

FIG. 1 is a diagram schematically illustrating a battery, a battery management system and devices peripheral to the battery management system, according to an embodiment.

Referring to FIG. 1, a vehicle includes a Battery Management System (BMS) 1, a battery 2, a current sensor 3, a cooling fan 4, an inrush current prevention unit 5, a main switch 6, an Engine Controller Unit (ECU) 7, an inverter 8, and a motor generator 9.

First, peripheral devices connected to the front of the BMS 1 will be described below.

The battery 2 includes a plurality of sub-packs 210, 220, 230, 240, 250 and 260 connected in series, output terminals 271 and 272, and a safety switch 273 connected between the sub-packs 230 and 240.

The sub-packs 210, 220, 230, 240, 250 and 260 are exemplarily illustrated as six sub-packs, and are referred to as a first sub-pack 210, a second sub-pack 220, a third sub-pack 230, a fourth sub-pack 240, a fifth sub-pack 250 and a sixth sub-pack 260. In FIG. 1, each of the first to six sub-packs 210 to 260 includes eight rechargeable battery cells that are connected in series, and the battery 2 includes a total of forty-eight battery cells, but exemplary embodiments are not limited thereto. Here, each of the sub-packs is illustrated as one group including a plurality of battery cells, and the battery 2 may be configured by directly connecting the forty-eight battery cells without dividing them into the first to sixth sub-packs 210 to 260.

The output terminals 271 and 272 are connected to the inverter 8 and motor generator 9 of the vehicle to supply an electric energy to an engine.

The safety switch 273 is one that is connected between the third and fourth sub-packs 230 and 240, and is a switch that is manually turned on/off for a worker's safety when changing the battery 2 or performing a work for the battery 2. In an embodiment, the safety switch 273 is connected between the third and fourth sub-packs 230 and 240, but it is not limited thereto. Although not shown, a fuse may be connected to the safety switch 273 in series. The fuse prevents (or protects from) an over current from being applied to the battery 2 due to a short (i.e., a short circuit). That is, when an over current is generated, the fuse is disconnected (e.g., melt) and thus prevents (or protects from) the over current from being applied to the battery 2.

The current sensor 3 measures the output current amount of the battery 2 and outputs the measured current amount to a sensing unit 10 of the BMS 1. In some embodiments, the current sensor 3 may be a hall current transformer that measures a current using a hall device to output an analog current signal corresponding to the measured current.

The cooling fan 4 dissipates heat that may be generated by the discharge/charge of the battery 2 according to the control signal of the BMS 1, thereby preventing the battery 2 from being deteriorated and the decrease of discharge/charge efficiency due to temperature rise.

The inrush current prevention unit 5 is located between the battery 2 and the inverter 8. The inrush current prevention unit 5 prevents (or protects from) an inrush current from being supplied from the battery 2 to the inverter 8, thereby preventing (or protecting from) the damage of the inverter 8 by the inrush current. In one embodiment, the inrush current prevention unit 5 includes a precharge resistor 5a, a precharge relay 5b, and a main relay 5c. Here, the precharge relay 5b is first turned on, and the inrush current is suppressed by the precharge resistor 5a and is gradually applied to the inverter 8. Subsequently, the precharge relay 5b is turned off and the main relay 5c is turned on, and thus, a current is stably supplied from the battery 2 to the inverter 8.

When an abnormal condition such as an over voltage, an over current and/or high temperature occurs, the main switch 6 turns on/off the battery 2 according to the control signal of the ECU 7 of the vehicle or the BMS 1.

In one embodiment, the BMS 1 includes the sensing unit 10, a Main Control Unit (MCU) 20, an internal power source supply unit 30, a cell balancing unit 40, a storage unit 50, a communication unit 60, a protection circuit 70, a power-on reset unit 80, and an external interface 90.

The sensing unit 10 measures the total pack currents and pack voltages of the battery 2 and the cell voltage, cell current, cell temperature and peripheral temperature of each of the battery cells and transfers the measured currents and voltages to the MCU 20.

The MCU 20 estimates the State Of Charge (SOC) and State Of Health (SOH) of the battery 2 on the basis of digital data that are transferred from the sensing unit 10 to control the charge/discharge of the battery 2. The digital data correspond to the total pack currents and pack voltages of the battery 2 and the cell voltage, cell current, cell temperature and peripheral temperature of each of the battery cells. In addition, the MCU 20 calculates the Open Circuit Voltage (OCV) of each of the battery cells with the cell voltage and cell current of each of the battery cells, or calculates a current value with a correction value. The MCU 20 measures the SOC of each of the battery cells with the OCV or the correction value. The MCU 20 detects a short battery cell (i.e., a short-circuited battery) capable of causing short among the plurality of battery cells while a vehicle powered by the battery 2 is in a parking state (i.e., during a parking period of the vehicle) by using the SOC difference value between the battery cells, and transfers the information of the short battery cell to the ECU 7. Here, the short battery cell denotes one in which a positive electrode and a negative electrode are electrically connected in the inside and thereby a voltage of the short battery cell decreases. For example, when a positive electrode active material or a negative electrode active material pierces and does damage to an insulating separator that is interposed between the positive electrode and the negative electrode, the battery cell is momentarily shorted, and thus the voltage of the battery cell may be momentarily reduced.

The internal power source supply unit 30 is a device that supplies a power source to the BMS 1 by using a sub-battery (e.g., a secondary battery).

The cell balancing unit 40 balances the charge state of each of the battery cells. That is, the cell balancing unit 40 may discharge a battery cell having a relatively high charge state, and may charge a battery cell having a relatively low battery cell.

The storage unit 50 stores data such as a current SOC or SOH when the power source of the BMS 1 is turned off. In one embodiment, the storage unit 50 is a nonvolatile memory device in which data may electrically be written and read, and may be an Electronically Erasable Programmable Read Only Memory (EEPROM).

The communication unit 60 communicates with the controller of the power generating apparatus of the vehicle.

The protection circuit 70 is one for protecting the BMS 1 from an external impulse, an over current and a low voltage and operates according to a firmware.

The power-on reset unit 80 resets an entire system when the power source of the BMS 1 is turned on.

The external interface 90 is a device for connecting the devices peripheral to the BMS 1 such as the cooling fan 4 and the main switch 6 to the MCU 20. In the embodiment of FIG. 1, although only the cooling fan 4 and the main switch 6 are illustrated, it is not limited thereto.

The ECU 7 determines a degree of torque to be generated on the basis of information such as the positions of accelerator and brake of the vehicle and the speed of the vehicle, and performs controlling of the output of the motor generator 9 to be in accordance with torque information. That is, the ECU 7 controls the switching of the inverter 8 in order for the output of the motor generator 9 to be in accordance with torque information. Here, the ECU 7 receives the SOC of the battery 2 that is transferred from the MCU 20 through the communication unit 60 of the BMS 1 and performs controlling in order for the SOC of the battery 2 to become a target value (for example, about 55%). For example, when the SOC transferred from the MCU 20 is equal to or less than about 55%, the ECU 7 controls the switching of the inverter 8 such that a power is outputted toward the direction of the battery 2, thereby charging the battery 2. At this point, a pack current "I" may have a positive (+) value. When the SOC is equal to or greater than about 55%, the ECU 7 controls the switching of the inverter 8 such that a power is outputted toward the direction of the motor generator 9, thereby discharging the battery 2. At this point, a pack current "I" may have a negative (−) value. Furthermore, the ECU 7 receives the SOH of the battery 2 that is transferred from the MCU 20 through the communication unit 60 of the BMS 1 and allows the SOH to be displayed on a display device such as the dashboard of the vehicle, thereby enabling a user to check the SOH. In addition, the ECU 7 receives information on a short battery cell capable of causing short among the plurality of battery cells while the vehicle is in a parking state from the MCU 20 and allows the received information to be displayed on the display device, thereby enabling the user to check the information on the short battery cell.

The inverter 8 charges or discharges the battery 2 according to the control signal of the ECU 7.

The motor generator 9 drives the vehicle in accordance with the torque information, which is transferred from the ECU 7, with the electric energy of the battery 2.

The following description will be made in more detail on the MCU 20 that detects a short battery cell capable of causing short among the plurality of battery cells while the vehicle is in a parking state.

Figure 2:
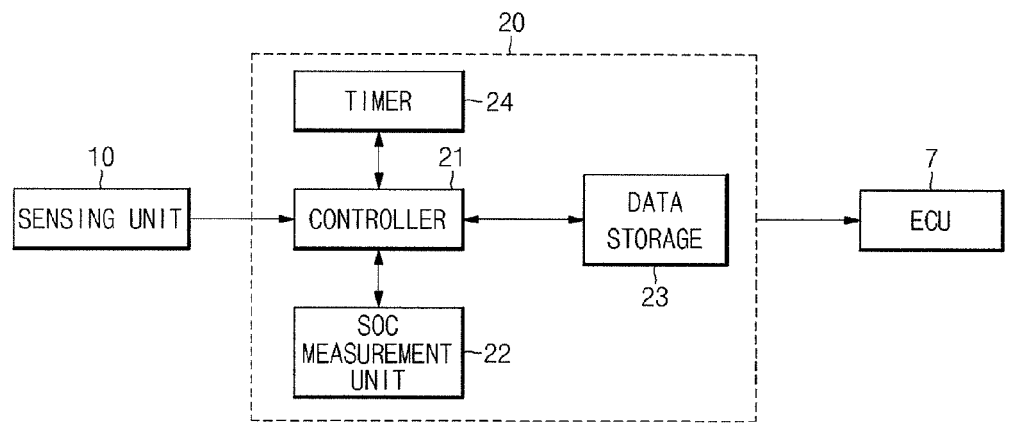
FIG. 2 is a diagram illustrating a configuration of a Main Control Unit (MCU) shown in FIG. 1.

FIG. 2 is a diagram illustrating a detailed configuration of the MCU 20 in FIG. 1.

Referring to FIG. 2, the MCU 20 includes a controller 21, an SOC measurement unit 22, a data storage 23, and a timer 24.

The controller 21 transmits the cell voltage and cell current of each of the battery cells, which are inputted from the sensing unit 10, to the SOC measurement unit 22 that measures the SOC of each battery cell in a key-off state and a key-on state. Specifically, the controller 21 utilizes the SOC measurement unit 22 to measure the first SOC of each battery cell in a key-off state, and utilizes the SOC measurement unit 22 to measure the second SOC of each battery cell in a key-on state after the key-off state. Here, the key-off state is a time when the power source of the BMS 1 is turned off, for example, a time when a vehicle enters into a parking mode. The key-on state is a time when the power source of the BMS 1 is turned on, for example, a time when a vehicle enters into a driving mode. As a result, a time between the key-off state and the key-on state may be the parking period of the vehicle. As described above, since the first SOC and second SOC of each battery cell are respectively measured in the key-off state and the key-on state, they may be used as parameters for detecting a short battery cell capable of causing short among the plurality of battery cells during the parking period of the vehicle. Here, the short battery cell capable of causing short among the plurality of battery cells is detected during the parking period of the vehicle because a battery cell, in which minor short occurs while the vehicle is driving, has a greater short due to self discharge during the parking period of the vehicle. This is because it is difficult to detect the battery cell, in which minor short occurs during the driving period of the vehicle, as the short battery cell.

The controller 21, as expressed in Equation (1) below, compares whether a first difference value "|SOC1_n−SOC2_n|" between the first SOC "SOC1_n" and second SOC "SOC2_n" (where n is a natural number) of each battery cell is greater than a first reference value "REF1," on the basis of the first SOC and the second SOC that are measured by the SOC measurement unit 22. For example, an SOC1_1 in which n is 1 may be defined as the first SOC of a first battery cell, and an SOC2_1 in which n is 1 may be defined as the second SOC of the first battery cell.

$$|SOC1\_n - SOC2\_n| > REF1 \qquad (1)$$

The controller 21 determines a battery cell, in which the first difference value "|SOC1_n−SOC2_n|" is greater than the first reference value "REF1" among the plurality of battery cells, as a short battery cell capable of causing short during a parking period, according to Equation (1). Here, the SOC is utilized to detect the short battery cell because the variation value of the SOC over time is small.

When a short battery cell is not detected because the first difference value "|SOC1_n−SOC2_n|" for all the plurality of battery cells is less than the first reference value "REF1" (for example, when minor short occurs in all the battery cells), as expressed in Equation (2), the controller 21 compares whether a second difference value "SOC2_max−SOC2_n" between the maximum value "SOC2_max" among the second SOC "SOC2_n" (where n is a natural number) of each battery cell and the second SOC "SOC2_n" of each battery cell is greater than a second reference value "REF2", on the basis of the first SOC and the second SOC that are measured by the SOC measurement unit 22.

$$SOC2\_max - SOC2\_n > REF2 \qquad (2)$$

The controller 21 determines a battery cell, in which the second difference value "SOC2_max−SOC2_n" is greater than the second reference value "REF2" among the plurality of battery cells, as a short battery cell capable of causing short during a parking period, according to Equation (2).

As described above, the controller 21 detects a short battery cell capable of causing short during a parking period among the plurality of battery cells through Equation (1), but when the short battery cell is not detected through Equation (1), the controller 21 may detect the short battery cell through Equation (2). In some embodiments, the controller 21 first detects a short battery cell capable of causing short during a parking period among the plurality of battery cells through Equation (2), and when the short battery cell is not detected because the second difference value "SOC2_max−SOC2_n" is less than the second reference value "REF2" in Equation (2) (for example, a similar degree of short occurs in all the plurality of battery cells, the controller 21 may detect the short battery cell through Equation (1).

The SOC measurement unit 22 may calculate the OCV of each battery cell by using the cell voltage and cell current of each battery cell that are inputted from the sensing unit 10 through the controller 21, and may measure the SOC of each battery cell with the OCV. Here, when the SOC measurement unit 22 measures the first SOC of the battery cell in a key-off state and transmits the measured SOC to the controller 21, the controller 21 stores the first SOC of the battery cell in the data storage 23. Furthermore, when the SOC measurement unit 22 measures the second SOC of the battery cell in a key-on state after the key-off state and transmits the measured SOC to the controller 21, the controller 21 stores the second SOC of the battery cell in the data storage 23. As a method of measuring the SOC of the battery cell, there are other suitable methods other than the method described above. In other exemplary embodiments, a method of measuring the SOC of the battery cell is not limited to the above described method.

The data storage 23 stores the first SOC and second SOC of the battery cell that are measured by the SOC measurement unit 22, and stores the first and second reference values REF1 and REF2 that are used when the controller 21 detects a short battery cell capable of causing short during a parking period among the plurality of battery cells. Here, as a time period between a key-off state and a key-on state increases, the first and second reference values REF1 and REF2 are increased and stored. That is, as the parking period of the vehicle becomes longer, the first and second reference values REF1 and REF2 are increased and stored. This is because as the parking period of the vehicle becomes longer, the self discharge amount of the battery cell increases, and consequently, the first difference value "|SOC1_n−SOC2_n|" and the second difference value "SOC2_max−SOC2_n" become greater. Here, the self discharge amount of the battery cell may be the same as the first difference value "|SOC1_n−SOC2_n|".

The timer 24 is controlled by the controller 21, and measures a key-off time and a key-on time and transfers the measured times to the data storage 23. Accordingly, the timer 24 allows the controller 21 to check the parking period of the vehicle with the key-off time and the key-on time and to use the first and second reference values REF1 and REF2 in accordance with the parking period of the vehicle when detecting a short battery cell capable of causing short during a parking period among the plurality of battery cells.

Next, the following simulation shows that the MCU 20 detects a short battery cell capable of causing short during a parking period among the plurality of battery cells through Equation (1) or (2).

Figure 3:
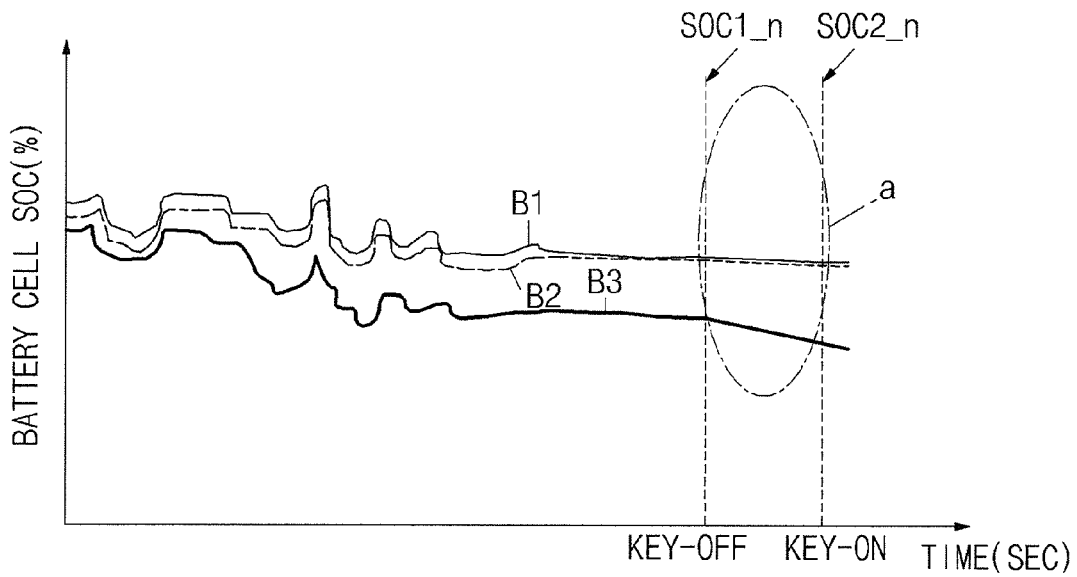
FIG. 3 is a graph illustrating the SOC of each of a plurality of battery cells which is measured by the MCU of FIG. 2.

FIG. 3 is a graph illustrating the SOC of each of the plurality of battery cells which is measured by the MCU of FIG. 2.

In FIG. 3, the graph shows the SOC of a battery cell over a period of time, and B1, B2 and B3 represent a plurality of battery cells. Here, B1 may represent a first battery cell, B2 may represent a second battery cell, and B3 may represent a third battery cell.

In FIG. 3, a portion "a" shows that the first difference value "|SOC1_3−SOC2_3|" of the third battery cell B3 is greater than the first reference value "REF1" through Equation (1), and thus it shows that the third battery cell B3 is a short battery cell capable of causing short during a parking period. Here, the portion "a" shows that the second difference value "|SOC2_max−SOC2_3|" of the third battery cell B3 is greater than the second reference value "REF2" through Equation (2), and thus it shows that the third battery cell B3 is a short battery cell capable of causing short during a parking period. As a result, it can be seen that the MCU 20 can detect a short battery cell capable of causing short during the parking period of a vehicle among the plurality of battery cells through Equation (1) or Equation (2).

The following description will be made on a driving method of a battery management system according to an embodiment.

Figure 4:
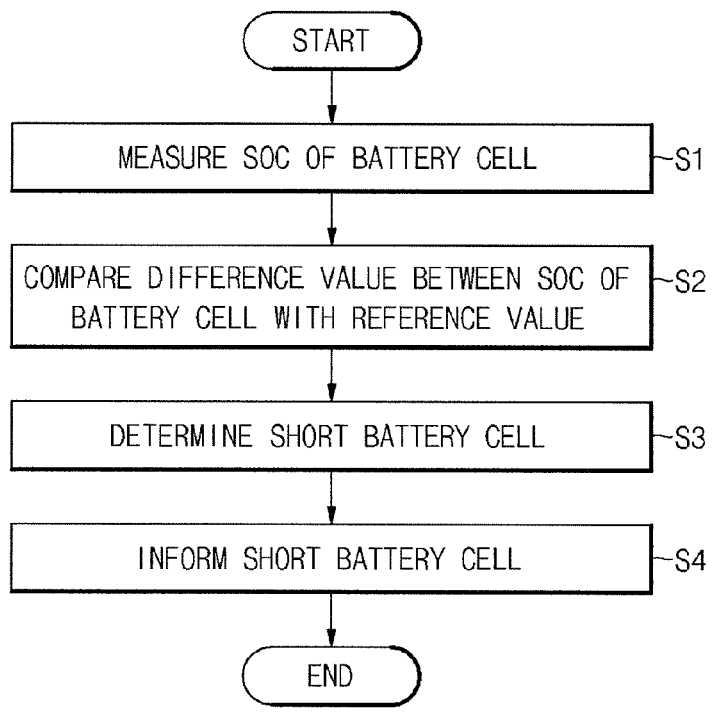
FIG. 4 is a flow chart illustrating a driving method of a battery management system according to an embodiment.
Figure 5A:
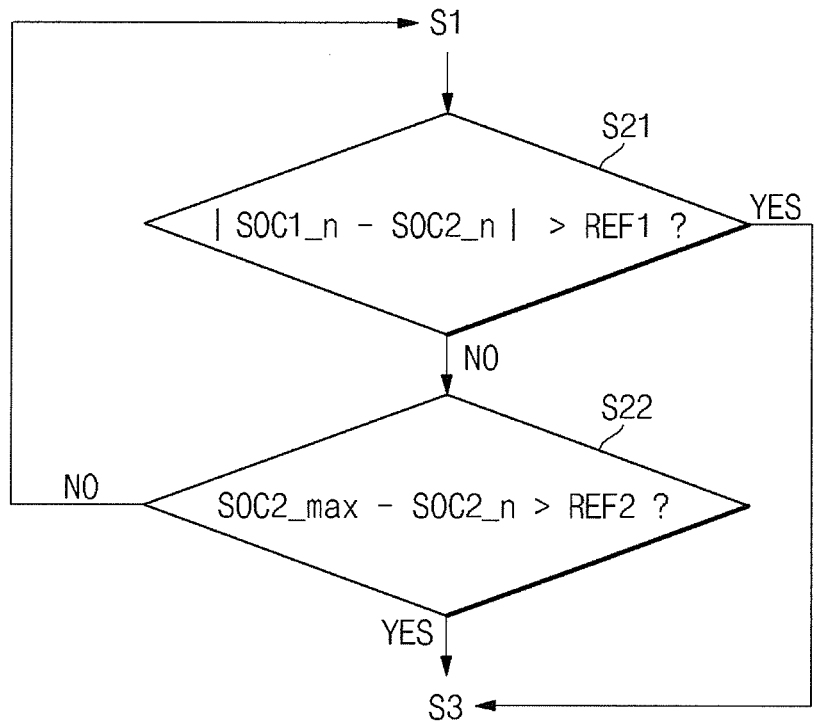
FIG. 5A is a flow chart for describing an example of an operation for comparing the SOC difference value of a battery cell and a reference value in FIG. 4.
Figure 5B:
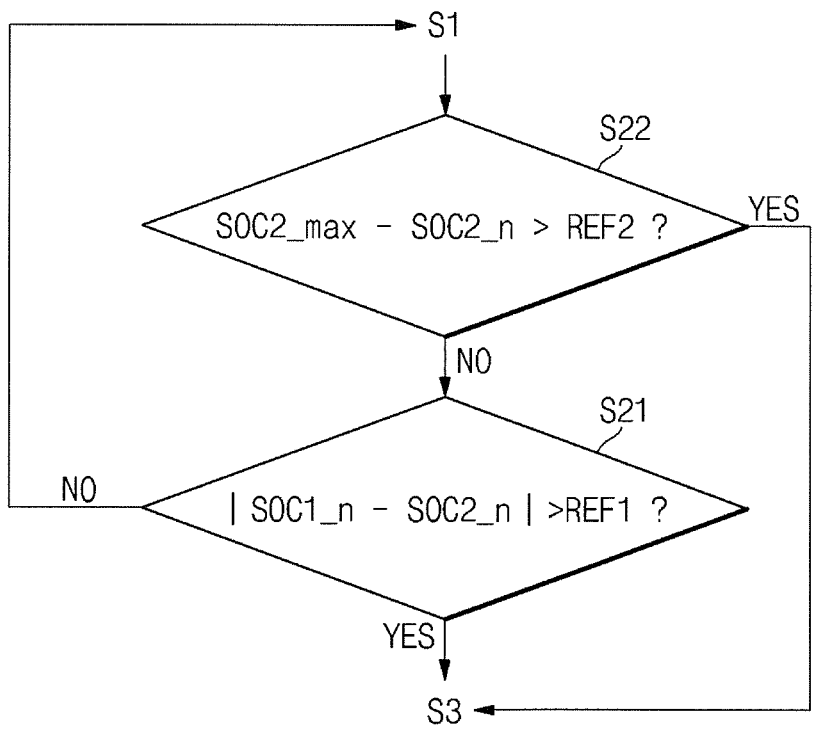
FIG. 5B is a flow chart for describing another example of an operation for comparing the SOC difference value of the battery cell and the reference value in FIG. 4.

FIG. 4 is a flow chart illustrating a driving method of a battery management system according to an embodiment. FIG. 5A is a flow chart for describing an example of an operation for comparing the SOC difference value of a battery cell and a reference value in FIG. 4. FIG. 5B is a flow chart for describing another example of an operation for comparing the SOC difference value of the battery cell and the reference value in FIG. 4.

Referring to FIG. 4, a driving method of a battery management system according to an embodiment includes operation S1 of measuring the SOC of a battery cell, operation S2 of comparing the SOC difference value of a battery cell and a reference value, operation S3 of determining a short battery cell, and operation S4 of informing the short battery cell.

In operation S1 of measuring the SOC of a battery cell, the SOC measurement unit 22 of the MCU 20 calculates the OCV of each battery cell by using the cell voltage and cell current of each battery cell that are inputted from the sensing unit 10 through the controller 21, and may measure the SOC of each battery cell with the OCV. Here, when the SOC measurement unit 22 measures the first SOC of each battery cell, which is used for detecting a short battery cell capable of causing short during a parking period among the plurality of battery cells, in a key-off state, and measures the second SOC of the battery cell in a key-on state after the key-off state and transmits the measured SOC. The first SOC and second SOC of each battery cell are stored in the data storage 23 through the controller 21.

In operation S1 of measuring the SOC of a battery cell, the timer 24 of the MCU 20 measures a key-off time and a key-on time. The key-off time and the key-on time are stored in the data storage 23. Accordingly, the controller 21 may check the parking period of a vehicle with the key-off time and the key-on time.

In operation S2 of comparing the SOC difference value of a battery cell and a reference value, as illustrated in FIGS. 5A and 5B, the controller 21 performs operation S21 of comparing whether the first difference value "|SOC1_n−SOC2_n|" between the first SOC "SOC1_n" (where n is a natural number) and second SOC "SOC2_n" of each battery cell is greater than the first reference value REF1, or performs operation S22 of comparing whether the second difference value "SOC2_max−SOC2_n" between the maximum value "SOC2_max" among the second SOC "SOC2_n" (where n is a natural number) of each battery cell and the second SOC "SOC2_n" of each battery cell is greater than the second reference value REF2. Here, the first and second reference values REF1 and REF2 are differently set according to the parking period of the vehicle and are stored in the data storage 23. Therefore, the controller 21 performs operation S2 of comparing the SOC difference value of a battery cell and a reference value by using the first and second reference values REF1 and REF2 in accordance with the parking period of the vehicle that are stored in the data storage 23.

Referring to FIG. 5A, in operation S2 of comparing the SOC difference value of a battery cell and a reference value, operation S21 may be first performed. In this case, when the first difference value "|SOC1_n−SOC2_n|" is greater than the first reference value REF1 in operation S21, operation S3 of determining a short battery cell is immediately performed, and when the first difference value "|SOC1_n−SOC2_n|" is less than the first reference value REF1, operation S22 is performed. Here, performing operation S3 of determining a short battery cell denotes that a short battery cell capable of causing short during a parking period among the plurality of battery cells is detected, and performing operation S22 denotes that a short battery cell is detected in another scheme because the short battery cell is not detected through operation S21. When the second difference value "SOC2_max−SOC2_n" is greater than the second reference value REF2 in operation S22, operation S3 of determining a short battery cell is performed, and when the second difference value "SOC2_max−SOC2_n" is less than the second reference value REF2, the driving method of a battery management system according to an embodiment is again performed from operation S1 of measuring the SOC of a battery cell. Here, when operation S1 of measuring the SOC of a battery cell is again performed, this denotes that short does not currently occur in a plurality of battery cells.

Referring to FIG. 5B, in operation S2 of comparing the SOC difference value of a battery cell and a reference value, operation S22 may be first performed. In this case, when the second difference value "SOC2_max−SOC2_n" is greater than the second reference value REF2 in operation S22, operation S3 of determining a short battery cell is immediately performed, and when the second difference value "SOC2_max−SOC2_n" is less than the second reference value REF2, operation S21 is performed. Here, performing operation S3 of determining a short battery cell denotes that a short battery cell capable of causing short during a parking period among the plurality of battery cells is detected, and performing operation S21 denotes that a short battery cell is detected in another scheme because the short battery cell is not detected through operation S22. When the first difference value "|SOC1_n−SOC2_n|" is greater than the first reference value REF1 in operation S21, operation S3 of determining a short battery cell is performed, and when the first difference value "|SOC1_n−SOC2_n|" is less than the first reference value REF1, the driving method of a battery management system according to an embodiment is again performed from operation S1 of measuring the SOC of a battery cell. Here, when operation S1 of measuring the SOC of a battery cell is again performed, this denotes that short does not currently occur in a plurality of battery cells.

As described above, in operation S2 of comparing the SOC difference value of a battery cell and a reference value, operation S21 may be first performed or operation S22 may be first performed. This may be determined according to the setting of the controller 21.

In operation S3 of determining a short battery cell, the controller 21 may determine a battery cell in which the first difference value "|SOC1_n−SOC2_n|" is greater than the first reference value REF1 or a battery cell in which the second difference value "SOC2_max−SOC2_n" is greater than the second reference value REF2 as a short battery cell capable of causing short during a parking period among the plurality of battery cells, according to the comparison result of operation S2 of comparing the SOC difference value of a battery cell and a reference value.

In operation S4 of informing the short battery cell, the MCU 20 transmits information of a short battery cell capable of causing short during a parking period to the ECU 7, thereby allowing the information to be displayed on a display device. Then, a user can check whether a short battery cell is detected or not.

As described above, the battery management system and the driving method thereof according to exemplary embodiments detect a short battery cell capable of causing short during a parking period among the plurality of battery cells by using the SOC of the battery cell before and after parking, and inform a user of the short battery cell, thereby enabling the user to check the short battery cell.

Accordingly, the battery management system and the driving method thereof according to exemplary embodiments enable to change the short battery cell, and thus can prevent the vehicle from exploding due to the short caused by the short battery cell.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made to the embodiments without departing from the spirit and scope of the present disclosure as set forth in the following claims and the equivalents thereof.

What is claimed is:

1. A battery management system comprising:
   a sensing unit for measuring a cell voltage and a cell current of each of a plurality of battery cells; and
   a main control unit (MCU) for measuring a state of charge (SOC) of each of the battery cells to control charge and discharge by utilizing the cell voltage and the cell current of each of the battery cells,
   wherein the MCU comprises:
   an SOC measurement unit for measuring a first SOC of each of the battery cells in a key-off state, and measuring a second SOC of each of the battery cells in a key-on state after the key-off state; and
   a controller for comparing whether a first difference value between the first SOC and the second SOC of each of the battery cells is greater than a first reference value or comparing whether a second difference value between a maximum value among the second SOC of each of the battery cells and the second SOC of each of the battery cells is greater than a second reference value to determine a short battery cell in which the first difference value is greater than the first reference value or the second difference value is greater than the second reference value from among the battery cells,
   wherein when the first difference value for all the plurality of battery cells is less than the first reference value, the controller is configured to compare whether the second difference value for at least one of the plurality of battery cells is greater than the second reference value.

2. The battery management system as claimed in claim 1, wherein the key-off state is a time when a power source of the battery management system is turned off.

3. The battery management system as claimed in claim 1, wherein the key-on state is a time when a power source of the battery management system is turned on.

4. The battery management system as claimed in claim 1, wherein as a time period between the key-off state and the key-on state increases, the first reference value increases.

5. The battery management system as claimed in claim 1, wherein as a time period between the key-off state and the key-on state increases, the second reference value increases.

6. The battery management system as claimed in claim 1, wherein the MCU further comprises a data storage for storing the first SOC, the second SOC, the first reference value and the second reference value.

7. The battery management system as claimed in claim 1, wherein the MCU further comprises a timer for measuring a time of the key-off state and a time of the key-on state.

8. The battery management system as claimed in claim 1, wherein when the second difference value for all the plurality of battery cells is less than the second reference value, the controller is configured to compare whether the first difference value is greater than the first reference value for at least one of the plurality of battery cells.

9. The battery management system as claimed in claim 1, wherein:
   the MCU is coupled to an engine controller unit (ECU) and a display device of a vehicle, and
   a time period between the key-off state and the key-on state is a parking time of the vehicle.

10. The battery management system as claimed in claim 9, wherein the MCU is configured to transmit information of the short battery cell to the ECU such that the ECU displays the information of the battery cell on the display device.

11. A driving method of a battery management system comprising a state of charge measurement unit and a controller, the driving method comprising:
    operating the state of charge measurement unit to measure a first State Of Charge (SOC) of each of a plurality of battery cells in a key-off state, and measuring a second SOC of each of the battery cells in a key-on state after the key-off state;
    operating the controller to compare whether a first difference value between the first SOC and the second SOC of each of the battery cells is greater than a first reference value, or comparing whether a second difference value between a maximum value among the second SOC of each of the battery cells and the second SOC of each of the battery cells is greater than a second reference value; and
    operating the controller to determine a short battery cell in which the first difference value is greater than the first reference value or the second difference value is greater than the second reference value from among the battery cells,
    wherein in the comparing of whether the first difference value is greater than the first reference value or whether the second difference value is greater than the second reference value, the comparing whether the first difference value between the first SOC and second SOC of each of the battery cells is greater than the first reference value is performed before the comparing whether the second difference value between the maximum value among the second SOC of each of the battery cells and the second SOC is greater than the second reference value.

12. The driving method as claimed in claim 11, wherein the comparing of whether the first difference value is greater than the first reference value or whether the second difference value is greater than the second reference value comprises comparing whether the second difference value is greater than the second reference value when the first difference value for all the plurality of battery cells is less than the first reference value.

13. The driving method as claimed in claim 11, further comprising displaying information of the short battery cell.

14. A driving method of a battery management system comprising a state of charge measurement unit and a controller, the driving method comprising:
    operating the state of charge measurement unit to measure a first State Of Charge (SOC) of each of a plurality of battery cells in a key-off state, and measuring a second SOC of each of the battery cells in a key-on state after the key-off state;
    operating the controller to compare whether a first difference value between the first SOC and the second SOC of each of the battery cells is greater than a first reference value, or comparing whether a second difference value between a maximum value among the second SOC of each of the battery cells and the second SOC of each of the battery cells is greater than a second reference value; and operating the controller to determine a short battery cell in which the first difference value is greater than the first reference value or the second difference value is greater than the second reference value from among the battery cells, wherein in the comparing of whether the first difference value is greater than the first reference value or whether the second difference value is greater than the second reference value, the comparing whether the second difference value between the maximum value among the second SOC of each of the battery cells and the second SOC of each of the battery cells is greater than the second reference value is performed before the comparing whether the first difference value between the first SOC and second SOC of each of the battery cells is greater than the first reference value.

15. The driving method as claimed in claim 14, wherein the comparing of whether the first difference value is greater than the first reference value or whether the second difference value is greater than the second reference value comprises comparing whether the first difference value is greater than the first reference value when the second difference value for all the plurality of battery cells is less than the second reference value.

* * * * *